(12) United States Patent
Kuo

(10) Patent No.: US 6,468,918 B1
(45) Date of Patent: *Oct. 22, 2002

(54) IN SITU PHOTORESIST HOT BAKE IN LOADING CHAMBER OF DRY ETCH

(75) Inventor: So Wein Kuo, Taipei (TW)

(73) Assignee: Taiwan Semiconductor Manufacturing Company, Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 922 days.

(21) Appl. No.: 08/536,485

(22) Filed: Sep. 29, 1995

(51) Int. Cl.[7] .......................................... H01L 21/3065
(52) U.S. Cl. ........................ 438/715; 438/735; 438/710; 156/345.31
(58) Field of Search .......................... 156/345; 118/719; 204/298.31, 298.35; 438/715, 710, 735

(56) References Cited

U.S. PATENT DOCUMENTS 5,174,881 A * 12/1992 Iwasaki et al. ......... 118/719 X
5,240,556 A * 8/1993 Ishikawa et al. ........ 156/345 X
5,380,682 A 1/1995 Edwards ..................... 437/225
5,407,867 A 4/1995 Iwasaki et al. ............. 437/228

OTHER PUBLICATIONS

"CNF Photolithography Process Notes Shipley 1400 Series Photoresist", Internet:www.cnf.cornell.edu/CNF/Processes/ph–resist_SH1400.html, Mar. 20, 1999, updated Nov. 20, 1996.

* cited by examiner

Primary Examiner—Thi Dang
(74) Attorney, Agent, or Firm—George O. Saile; Stephen B. Ackerman; Billy Knowles

(57) ABSTRACT

An apparatus and method for the hot bake to remove moisture from photoresist that has been deposited on semiconductor wafers prior to a dry plasma etch process. A wafer carrier containing semiconductor wafers on which a photoresist has been deposited is placed in a load lock chamber having a source of heat such as a heating plate or a high intensity light source. The source of the heat is activated and the semiconductor wafers are brought to a temperature sufficiently high and of a sufficient duration as to eliminate any moisture present in the photoresist mask. The load lock chamber is evacuated to eliminate any moisture or contaminants, filled with nitrogen to eliminate any residual of moisture or contaminants, and then evacuated to prepare the chamber to exposed to the atmosphere present in a dry plasma etch chamber. An exit lock of the load lock chamber is opened and the wafer carrier is placed in the dry plasma etch chamber for the execution of the dry plasma etch process.

1 Claim, 3 Drawing Sheets

FIG. 1 – Prior Art

IN SITU PHOTORESIST HOT BAKE IN LOADING CHAMBER OF DRY ETCH

BACKGROUND OF THE INVENTION

1. Field of the Invention

The present invention relates to an apparatus for and a method of hot baking of photoresist prior to the dry plasma etch of a semiconductor process.

2. Description of the Background Art

Referring to FIG. 1, a wafer carrier 30 is loaded with one or a plurality of semiconductor wafers 20 and is placed in the hot bake chamber 10 on the carrier transport 40 through the chamber lock 50. The hot plate 60 is activated such that the semiconductor wafer 20 is brought to a temperature sufficient to allow any moisture to be driven from the photoresist mask that has been deposited on the semiconductor wafers 20. The temperature is approximately 120° C. for a period of approximately 90 seconds. Once the moisture has been driven from the photoresist, the hot plate 60 is deactivated and the chamber lock 55 is opened. The wafer carrier is moved from the hot bake chamber 10 into the load and lock chamber 70 by the activation of motors (not shown) attached to the carrier transports 40 and 80. The chamber locks 55 and 75 are sealed and the load and lock chamber 70 is evacuated to a high degree by a vacuum pump (not shown) attached to the exhaust valves 100. Once sufficient vacuum has been achieved, exhaust valves 100 are closed and the inlet valves 90 are opened to allow nitrogen ($N_2$) to be pumped into the load and lock chamber 70. After a sufficient level of $N_2$ has been achieved, the inlet valves 90 are closed, the exhaust valves 100 are opened, and the $N_2$ is evacuated from the load and lock chamber 70. Chamber lock 75 is then opened and the motors (not shown) for the carrier transports 80 and 120 are activated to move the wafer carriers 30 containing the semiconductor wafers 20 from the load and lock chamber 70 to the Dry Plasma Etch Chamber 110. In the Dry Plasma Etch Chamber 110, the surface of the semiconductor wafers 20 are etched.

In U.S. Pat. No. 5,380,682 (Issued Jan. 10, 1995 to Edwards, et al. for "Wafer Processing Cluster Tool Batch Preheating and Degassing Method") teaches a technique for the preparation of semiconductor wafers for processing by preheating the wafers to a high temperature to drive out gas contaminants on the surface of the semiconductor wafers.

In U.S. Pat. 5,407,867 (issued Apr. 18, 1995 to Iwasaki, et al. for "Method Of Forming A Thin Film On Surface Of Semiconductor Substrate") Illustrates a technique for the removal of natural oxides and contaminants from the surface of semiconductor substrates and then depositing a thin film material upon the semiconductor substrate.

SUMMARY OF THE INVENTION

An object of the invention is an apparatus to hot bake the photoresist deposited upon a semiconductor wafer in the loading chamber prior to a plasma dry etch process. The purpose of the hot bake is the removal of moisture from the photoresist.

This apparatus is comprising a chamber in which a wafer carrier containing one or more semiconductor wafers is placed through an entrance lock; a heating source such as a heating plate or high intensity light source to bake the moisture from the photoresist; an exhaust valving system coupled to a vacuum pump to evacuate the chamber; an inlet valving system coupled to a source of $N_2$ to fill the chamber with $N_2$; and an exit lock to allow the carrier transport to move the carrier to the plasma dry etch chamber.

DETAILED DESCRIPTION OF THE INVENTION

Figure 1:
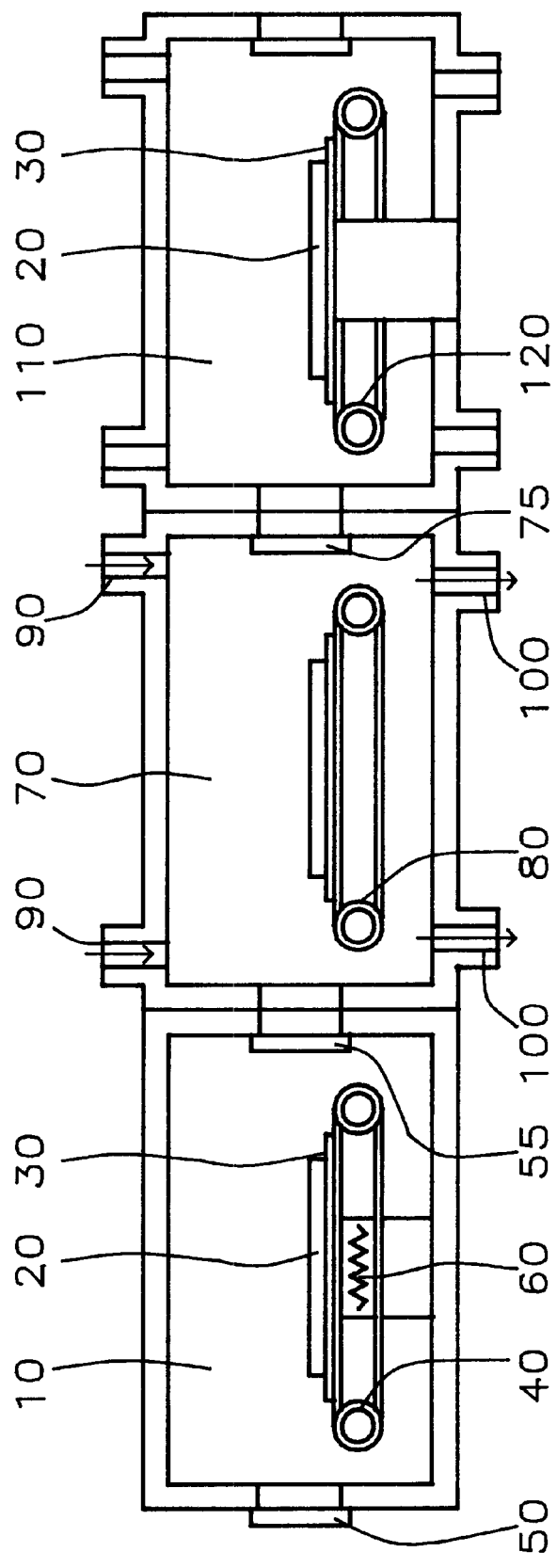
FIG. 1 is a cross sectional diagram of the apparatus to prepare and load a dry plasma etch chamber of prior art.
Figure 2:
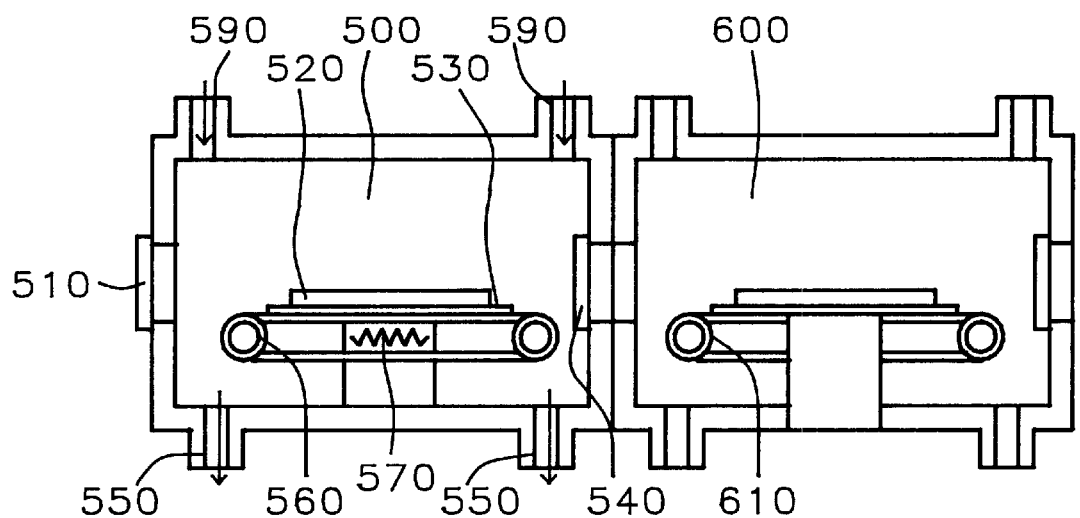
FIG. 2 is a cross sectional diagram of the apparatus to prepare and load a dry plasma etch chamber of an implementation of the preferred embodiment of this invention.

Referring to FIG. 2, one or a plurality of semiconductor wafers 520 that have a photoresist mask deposited upon them are placed on a wafer carrier 530. The load lock 510 is opened and the wafer carrier is placed on the carrier transport 560. The load lock 610 and the exit lock 540 is closed and sealed. The heater plate is activated to increase the temperature on the semiconductor wafers 520 to a temperature sufficient to drive the moisture from the photoresist. The temperature of this process is approximately 120° C. for a period of 90 seconds. After the moisture has been driven from the photoresist, the heating plate is deactivated and a vacuum pump (not shown) that is attached to the exhaust valves 550 is activated and the exhaust valves 560 are opened. The load lock chamber 500 is evacuated to a high degree. When a sufficient vacuum is achieved the exhaust valves 550 are closed and the inlet valves 590 are opened. Inlet valves 590 are coupled to a source of $N_2$ which is pumped in to the load lock chamber 500. When sufficient amount of $N_2$ is pumped into the load lock chamber 500, the inlet valve 590 is closed, the exhaust valves 550 are opened, and the vacuum pump (not shown) is activated. When the load lock chamber 600 has been sufficiently evacuated, the vacuum pump is deactivated and the exhaust valves 550 are closed. The exit lock 540 is opened, carrier transports 560 and 610 are activated, and the wafer carrier 530 is transferred to the dry plasma etch chamber 600 for the dry plasma etch process.

Figure 3:
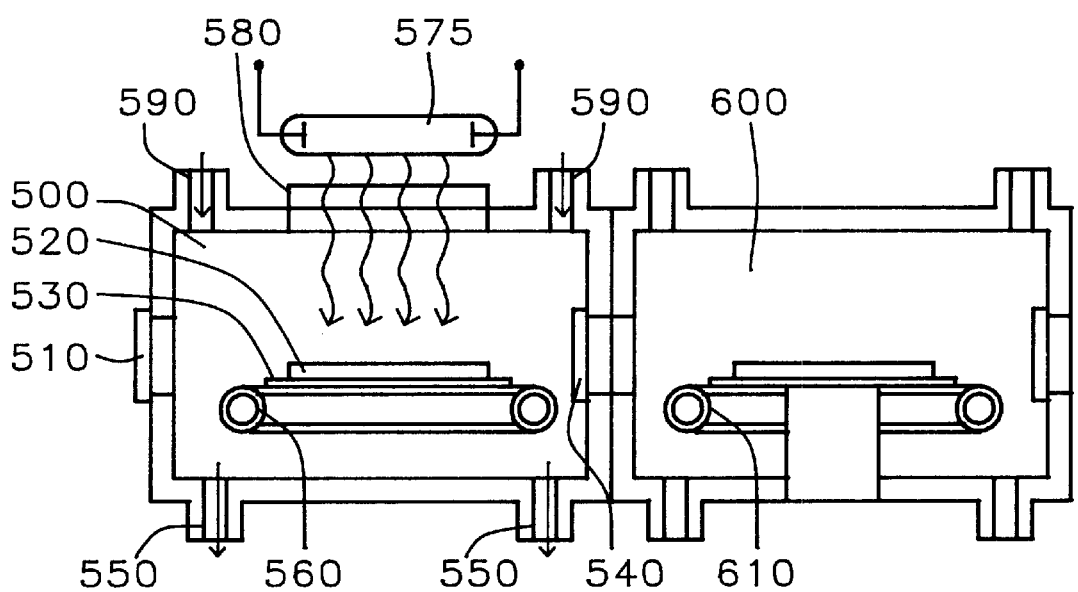
FIG. 3 is a cross sectional diagram of the apparatus to prepare and load a dry plasma etch chamber of another implementation of the preferred embodiment of this invention.

Referring to FIG. 3, the heater plate 570 of FIG. 2 is replaced by a high intensity lamp 575 that is capable of radiating light in the visible and infrared light spectrum. A transparent material 580 is placed in the wall of the load lock chamber 500 to allow the radiation from the high intensity lamp 575 to impinge upon the surface of the semiconductor wafers 520. As previously described, the semiconductor wafers 520 are placed in the load lock chamber 500, but instead of activating the heating plate 570 of FIG. 2, the high intensity lamp 575 is activated to force the moisture from the photoresist.

Figure 4:
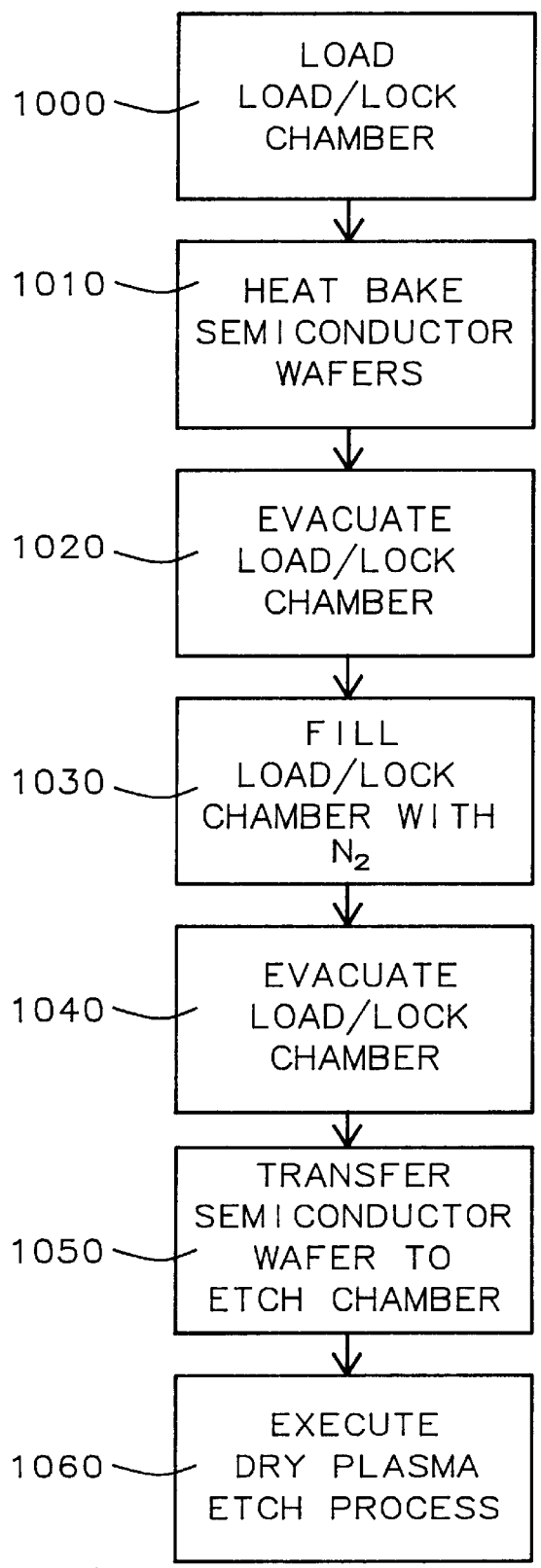
FIG. 4 is a diagram of the flow of the method to hot bake the photoresist of this invention.

Referring to FIG. 4, the first step of the method for the application of the hot bake apparatus is to load the load lock chamber with a carrier containing one or more semiconductor wafers that have been coated with a photoresist mask 1000. The semiconductor wafers are then heated to a temperature sufficient to eliminate any moisture from the photoresist mask coating on the semiconductor wafers 1010. After the heating, the load lock chamber is evacuated by a vacuum pump to eliminate any moisture or contaminants from the load lock chamber 1020. The load lock chamber is then filled with N$_2$ to insure the elimination of any moisture and contaminants 1030. After the N$_2$ has been pumped into the load lock chamber, the load lock chamber is then again evacuated to prepare the load lock chamber for exposure to the atmosphere of the dry plasma etch chamber 1040. The semiconductor wafers are then transferred from the load lock chamber to the dry plasma etch chamber 1050 and finally exposed to the dry plasma etch process 1060.

What is claimed is:

1. A method for in situ hot bake comprising the steps of:
   a) loading a load lock chamber with a wafer carrier containing at least one semiconductor wafer having a photoresist mask deposited upon each semiconductor wafer;
   b) heating of the semiconductor wafers within said load lock chamber to a temperature of approximately of 120° C. by a heating source selected from a group of heating sources consisting of heater plate and a high intensity lighting source through a transparent material section of the load lock chamber to eliminate any moisture present in the photoresist mask;
   c) evacuating the load lock chamber to eliminate moisture or contaminants from the chamber;
   d) filling the chamber with nitrogen to eliminate any residual moisture and contaminants;
   e) evacuating the chamber to eliminate the nitrogen from the atmosphere of the chamber;
   f) opening the exit lock to transport the wafer carrier to the dry plasma etch chamber, and
   g) executing the dry plasma etch process.

* * * * *